(12) United States Patent
Peters et al.

(10) Patent No.: US 8,649,205 B2
(45) Date of Patent: Feb. 11, 2014

(54) MEMORY CELL, A METHOD FOR FORMING A MEMORY CELL, AND A METHOD FOR OPERATING A MEMORY CELL

(75) Inventors: Christian Peters, Vaterstetten (DE); Mihail Jefremow, Augsburg (DE); Jan Otterstedt, Unterhaching (DE); Wolf Allers, Munich (DE); Robert Wiesner, Bad Aibling (DE)

(73) Assignee: Infineon Technologies AG, Neubiberg (DE)

( * ) Notice: Subject to any disclaimer, the term of this patent is extended or adjusted under 35 U.S.C. 154(b) by 145 days.

(21) Appl. No.: 13/370,377

(22) Filed: Feb. 10, 2012

(65) Prior Publication Data

US 2013/0208527 A1  Aug. 15, 2013

(51) Int. Cl.
*G11C 11/00* (2006.01)
(52) U.S. Cl.
USPC .......................................... 365/148; 365/100
(58) Field of Classification Search
USPC ............................................... 365/148, 100
See application file for complete search history.

(56) References Cited

U.S. PATENT DOCUMENTS

| 7,295,465 | B2 | 11/2007 | Tanizaki et al. |
| 7,428,163 | B2 * | 9/2008 | Hoenigschmid et al. ..... 365/148 |
| 2005/0007815 | A1 | 1/2005 | Adelmann |
| 2005/0152185 | A1 | 7/2005 | Terzioglu |
| 2010/0223532 | A1 | 9/2010 | Kang et al. |
| 2011/0080778 | A1 | 4/2011 | Toda |

FOREIGN PATENT DOCUMENTS

DE  10252822 A1  11/2003

OTHER PUBLICATIONS

"Magnetoresistive Random Access Memory (MRAM)", James Daughton, Feb. 4, 2000, pp. 1-13.
"Latest Advances and Roadmap for In-Plane and Perpendicular STT-RAM", Driskill-Smith et al., 978-1-4577-0224-2/11, 2011 IEEE, pp. 50-52.
"Spin-Transfer Torque MRAM (STT-MRAM): Challenges and Prospects", Yiming Huai, AAPPS Bulletin Dec. 2008, vol. 18, No. 6, pp. 33-40.
German Office Action, dated Dec. 2, 2013.

* cited by examiner

*Primary Examiner* — Son Dinh
*Assistant Examiner* — Nam Nguyen

(57) ABSTRACT

A memory cell is provided, the memory cell including a first two-terminal memory element; a second two-terminal memory element; a controller circuit configured to program the first two-terminal memory element to one or more states and the second two-terminal memory element to one or more states, wherein a state of the first two-terminal memory element and a state of the second two-terminal memory element are interdependent; and a measuring circuit configured to measure a difference signal between a first two-terminal memory element signal associated with the state of the first two-terminal memory element and a second two-terminal memory element signal associated with the state of the second two-terminal memory element.

26 Claims, 10 Drawing Sheets

Write

Programming a first two-terminal memory element to one or more states and a second two-terminal memory element to one or more states, wherein a state of the first two-terminal memory element and a state of the second two-terminal memory element are interdependent; and ~ 310 measuring a difference signal between a first two-terminal memory element signal associated with the state of the first two-terminal memory element and a second two-terminal memory element signal associated with the state of the second two-terminal memory element. ~ 320

Erase

Write

Read
Example: erased state

MEMORY CELL, A METHOD FOR FORMING A MEMORY CELL, AND A METHOD FOR OPERATING A MEMORY CELL

TECHNICAL FIELD

Various embodiments relate generally to a memory cell, a method for forming a memory cell, and a method for operating a memory cell.

BACKGROUND

Many innovative non-volatile memory NVM applications and concepts, e.g. magnetoresistive random access memory MRAM, e.g. resistive random access memory RRAM, e.g. conductive-bridge random access memory CBRAM, e.g. phase change memory PCRAM suffer from a very small read current window in comparison to classical floating gate FLASH cells. Over the lifetime of the memory cell, the memory cell may suffer from an unstable read current window, especially when typically large distribution widths in larger cell fields are considered. Up till now, attempts have been made to make small read windows usable, for example, through a variable reference, through the use of stronger error-correcting codes ECC, complex program algorithms, and through restrictions to specifications such as temperature and cycle numbers. The error rates of the memory are unfortunately so high that they have not been considered for more advanced or complex applications.

Spin-Transfer-Torque magnetic random access memory STT-MRAM cells, for example, have a low resistance difference between the erased and the written state, typically having a 100% resistance change, e.g. 2 k Ohm vs. 4 k Ohm. To distinguish the levels during the reading, the reference current for the sense amplifier must be located exactly between the two levels, i.e. exactly between the erased and written state. A challenge faced in STT-MRAM arrays is that while normally a combination of erased and programmed reference cells may be used to generate the reference current, which may help to read the state of the selected cell, they may fail if the current distributions of the full memory are wide or close together.

SUMMARY

Various embodiments provide a memory cell, including a first two-terminal memory element; a second two-terminal memory element; a controller circuit configured to program the first two-terminal memory element to one or more states and the second two-terminal memory element to one or more states, wherein a state of the first two-terminal memory element and a state of the second two-terminal memory element are interdependent; and a measuring circuit configured to measure a difference signal between a first two-terminal memory element signal associated with the state of the first two-terminal memory element and a second two-terminal memory element signal associated with the state of the second two-terminal memory element.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a method for operating a memory cell according to an embodiment.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Various embodiments provide a two-element memory cell using emerging non-volatile memories, e.g. STT-MRAM, e.g. CBRAM, e.g. RRAM, for differential sensing.

Various embodiments provide two complementary memory elements in a one bit memory cell, wherein a READ window for determining a state of the memory cell may be doubled.

Various embodiments provide a differential reading concept which may avoid the use of a global reference, i.e. comparing a state of a memory cell to a global reference cell, for reading a state of the memory cell, and which may also optimize area of the memory cell.

Various embodiments provide a memory cell which may include a local reference element in every cell.

Figure 1:
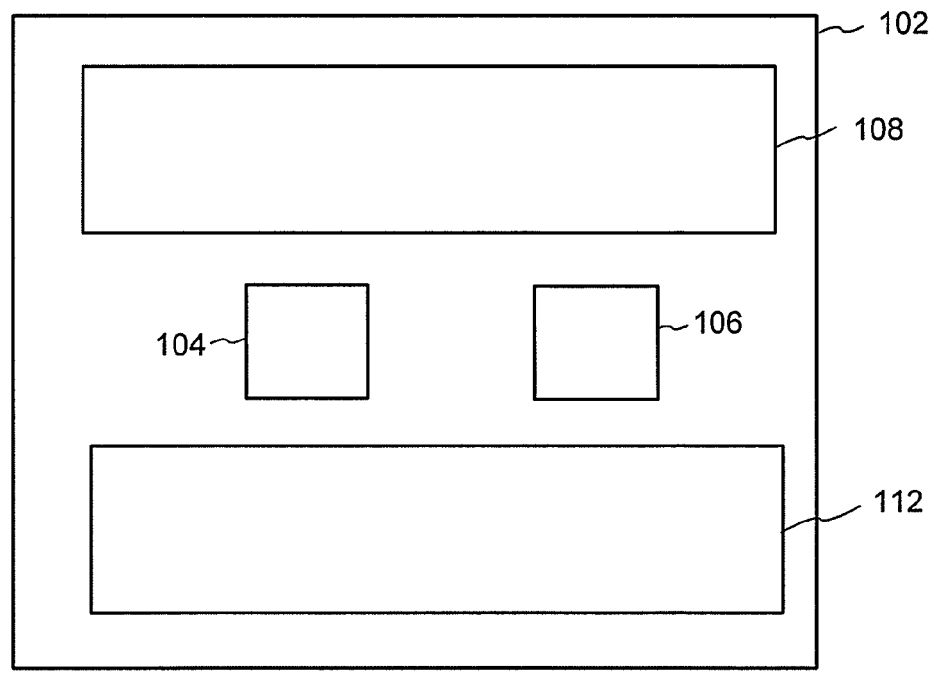
FIG. 1 shows a memory cell according to an embodiment.

FIG. 1 shows memory cell 102 according to an embodiment.

Memory cell 102 includes first two-terminal memory element 104, second two-terminal memory element 106, controller circuit 108 and measuring circuit 112. Controller circuit 108 may be configured to program first two-terminal memory element 104 to one or more states and second two-terminal memory element 106 to one or more states, wherein a state, e.g. a memory state, of first two-terminal memory element 104 and a state, e.g. a memory state, of second two-terminal memory element 106 may be interdependent. Measuring circuit 112 may be configured to measure a difference signal between a first two-terminal memory element signal associated with the state of first two-terminal memory element 104 and a second two-terminal memory element signal associated with the state of second two-terminal memory element 106. Controller circuit 108 may be implemented as a hardwired logic controller circuit, e.g. controller circuit 108 may include a hardwired logic microprocessor. Controller circuit 108 may be implemented as a programmable logic controller circuit, e.g. controller circuit 108 may include a programmable logic microprocessor, e.g. controller circuit 108 may include a programmable logic array, e.g. controller circuit 108 may include a field programmable gate array FPGA integrated circuit.

A two-terminal memory element, e.g. 104, e.g. 106 may include a memory element which may include at any one time a single terminal configured for the entry of charge carriers into the element and a single terminal configured for the exit of charge carriers from the element. A two-terminal memory element, e.g. 104, e.g. 106 may include a memory element having a single source of current flow at any one time. A two-terminal memory element, e.g. 104, e.g. 106 may include a memory element which may be programmed and read using current flowing through the memory cell. A two-terminal memory element, e.g. 104, e.g. 106 may include a memory element wherein the same two terminals may be used for programming and reading current flow, wherein the current flow may be through the same two terminals for all the before mentioned operations.

Figure 2:
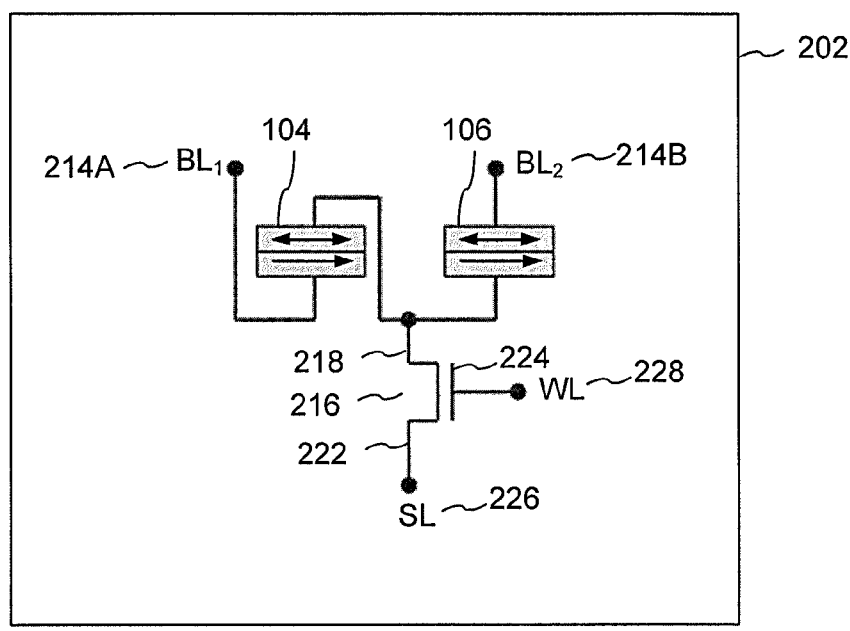
FIG. 2 shows a memory cell according to an embodiment.

FIG. 2 shows memory cell 202 according to an embodiment.

The basic functionalities of all the features described with respect to memory cell 102 are applicable to memory cell 202.

First two-terminal memory element 104 and second two-terminal memory element 106 may be integrated into memory cell 202, wherein memory cell 202 is a one bit-cell.

First two-terminal memory element 104 and second two-terminal memory element 106 may each include a magnetoresistive random access two-terminal memory element, such as a magnetic tunnel junction MTJ stack. The magnetic tunnel junction stack may include a free magnetic layer; and a fixed magnetic layer separated from the free magnetic layer by an isolation layer (See FIG. 4). Fixed magnetic layer 434 and free magnetic layer 432 may each include a ferromagnetic layer, e.g. fixed magnetic layer 434 and free magnetic layer 432 may each include at least one from the following group of materials, the group consisting of: cobalt, iron, cobalt-iron, boron. Fixed magnetic layer 434 may have its magnetization fixed by an anti-ferromagnetic pinning layer (not shown). Anti-ferromagnetic pinning layer may be formed adjacent to fixed magnetic layer 434. Isolation layer may be formed on an opposite side of fixed magnetic layer 434 to the anti-ferromagnetic pinning layer. Isolation layer 436 may include a tunnel barrier material. Isolation layer 436 may include magnesium oxide, MgO. Free magnetic layer 432 may have a thickness ranging from about 0.5 nm to about 5 nm, e.g. about 1 nm to about 3 nm, e.g. about 1.2 nm to about 2.5 nm. Fixed magnetic layer 434 may have a thickness ranging from about 0.5 nm to about 5 nm, e.g. about 1 nm to about 3 nm, e.g. about 1.2 nm to about 2.5 nm.

First two-terminal memory element 104 and second two-terminal memory element 106 may each include a conductive bridging random access memory CBRAM element.

First two-terminal memory element 104 and second two-terminal memory element 106 may each include a resistive random access memory RRAM element, e.g. an RRAM element including a carbon-based memory element, e.g. a carbon-based memory element which may be switched between a first resistivity state, e.g. a low resistance value and a second resistivity state, e.g. a high resistance value. A carbon-based memory element may be switched between an $sp^2$-rich state and a $sp^3$-rich state, wherein an $sp^2$-rich state may include a low resistance state, and may represent a "1" bit value and an $sp^3$-rich state may include a high resistance state, and may represent a "0" bit value.

First two-terminal memory element 104 and second two-terminal memory element 106 may each be electrically coupled between at least one bit line 214 and at least one access transistor 216. According to various embodiments, first two-terminal memory element 104 and second two-terminal memory element 106 may be electrically coupled to different bit lines 214A, 214B, e.g. first two-terminal memory element 104 may be electrically coupled to bit line $BL_1$ 214A, e.g. second two-terminal memory element 106 may be electrically coupled to bit line $BL_2$ 214B.

At least one access transistor 216 may include first source/drain region 218; second source/drain region 222; and gate region 224. First source/drain region 218 may be electrically coupled to first two-terminal memory element 104 and second two-terminal memory element 106. Second source/drain region 222 may be electrically coupled to source line 226 of memory cell 202. Gate region 224 may be electrically coupled to word line 228 of memory cell 202.

One of first two-terminal memory element 104 and second two-terminal memory element 106 may be reverse connected, e.g. oppositely connected with respect to the other memory element, to allow a simple erase/write operation.

A voltage may be applied across first two-terminal memory element 104 and second two-terminal memory element 106. A voltage may be applied between bit line $BL_1$ 214A and SL 226 across first two-terminal memory element 104. A voltage may be applied between bit line $BL_2$ 214A and SL 226 across second two-terminal memory element 106.

One of first two-terminal memory element 104 and second two-terminal memory element 106 may be reverse connected with respect to a voltage applied across first two-terminal memory element 104 and second two-terminal memory element 106.

Depending on the voltages applied at source line 226 and the bit lines $BL_1$ 214A, $BL_2$ 214B, one of the first two-terminal memory element 104 and second two-terminal memory element 106 will be erased and the other will be written in the same step, i.e. by the application of the voltage across first two-terminal memory element 104 and second two-terminal memory element 106.

Controller circuit 108 (not shown) may be configured to program first two-terminal memory element 104 and second two-terminal memory element 106 to different states.

Controller circuit 108 may be configured to program interdependently first two-terminal memory element 104 to a first state and second two-terminal memory element 106 to a second state, and to program interdependently first two-terminal memory element 104 to a second state and second two-terminal memory element 106 to a first state, wherein the second state is different from the first state, e.g. opposite or inverse to the first state.

FIG. 3 shows method 300 for operating a memory cell, e.g. memory cell 102, e.g. memory cell 202, according to an embodiment.

Method 300 may include programming a first two-terminal memory element to one or more states and a second two-terminal memory element to one or more states, wherein a state of the first two-terminal memory element and a state of the second two-terminal memory element are interdependent (in 310); and measuring a difference signal between a first two-terminal memory element signal associated with the state of the first two-terminal memory element and a second two-terminal memory element signal associated with the state of the second two-terminal memory element (in 320).

Figure 4A:
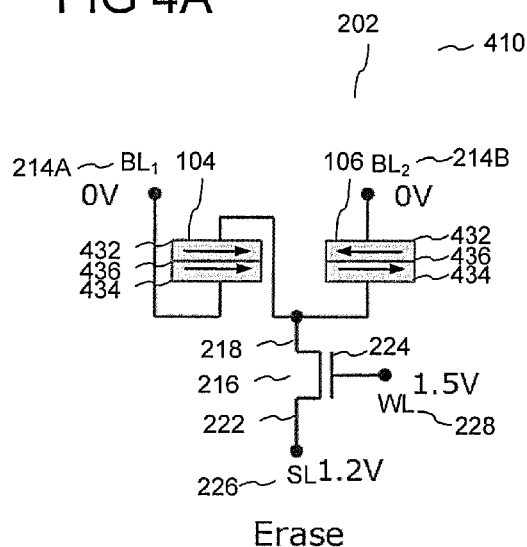
FIGS. 4A to 4C show a method for operating a memory cell according to an embodiment.
Figure 4B:
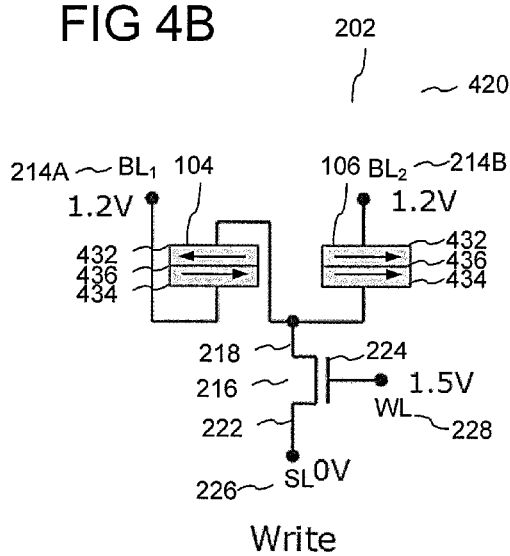
Figure 4C:
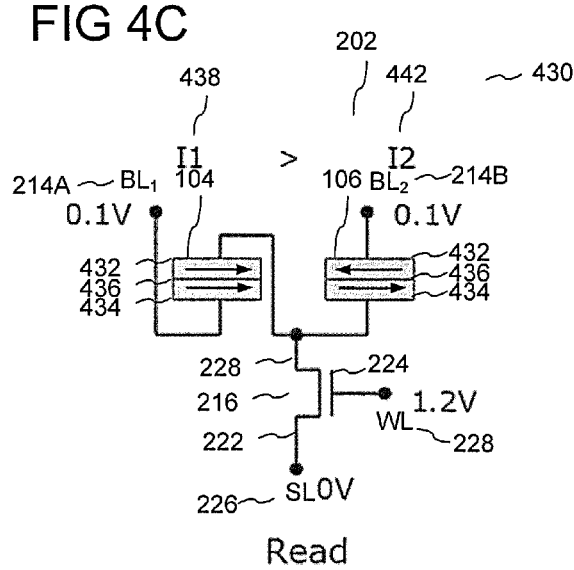

FIGS. 4A to 4C show a method 400 for operating a memory cell, e.g. memory cell 102, e.g. memory cell 202, according to an embodiment.

Method 400 may include programming first two-terminal memory element 104 to one or more states and second two-terminal memory element 106 to one or more states, wherein a state of the first two-terminal memory element and a state of the second two-terminal memory element are interdependent (as in 310 of method 300).

FIGS. 4A to 4C will be described with respect to a method 400 for operating a memory cell 202, wherein memory cell 202 may include magnetoresistive random access two-terminal memory elements 104, 106, e.g. magnetic tunnel junction MTJ stacks, e.g. double magnetic tunnel junction DMTJ stacks. However, two-terminal memory elements 104, 106 are not restricted to magnetoresistive random access two-terminal memory element, e.g. spin torque transfer magnetic tunnel junction MTJ stacks. Two-terminal memory elements 104, 106 may include switchable resistive memory cells, e.g. resistive random access memory RRAM memory elements. Two-terminal memory elements 104, 106 may include conductive bridge random access memory CBRAM elements.

First two-terminal memory element 104 and second two-terminal memory element 106 may each include a magnetoresistive random access two-terminal memory element, such as a magnetic tunnel junction MTJ stack.

Each MTJ stack may include free magnetic layer 432 and fixed magnetic layer 434 separated from free magnetic layer 432 by isolation layer 436.

Each individual two terminal memory element 104, 106 may be programmed to two different states. Assuming, each of the two-terminal memory element 104, 106 are substantially identical, each of the two-terminal memory element 104, 106, may be programmed to a first state in response to an applied voltage, and to a second state, e.g. a different state, in response to a different applied voltage.

The first state may include a first resistance value, e.g. a low resistance value, wherein free magnetic layer 432, in response to an applied voltage, may be in parallel with fixed magnetic layer 434.

The second state may include a second resistance value, e.g. a high resistance value, wherein free magnetic layer 432, in response to an applied voltage, may be in anti-parallel with fixed magnetic layer 434.

According to various embodiments, first two-terminal memory element 104, e.g. first MTJ stack, may be programmed to a first state or a second state. Second two-terminal memory element 106, e.g. second MTJ stack, may include two programmable states. Second two-terminal memory element 106 may be programmed to a first state or a second state.

Memory cell 202 may include a single bit, i.e. a one bit-cell. Memory cell 202 may be configured to be programmed to a first bit-value, e.g. an ERASE state. Memory cell 202 may be programmed to a second bit-value, e.g. a WRITE state.

As shown in FIG. 4A, memory cell 202 may be configured to be programmed to a first bit value, e.g. an ERASE state, wherein a first voltage, e.g. ERASE voltage, may be applied across first two-terminal memory element 104 and second two-terminal memory element 106. The application of first voltage may program first two-terminal memory element 104 to a first state. Therefore, first two-terminal memory element 104 may be programmed to a first state, e.g. to a "1" state, e.g. to a low resistance value due to the parallel alignment of free magnetic layer 432 with fixed magnetic layer 434. As one of first two-terminal memory element 104 and second two-terminal memory element 106 may be reverse connected with respect to the first voltage applied across the first two-terminal memory element and the second two-terminal memory element, second two-terminal memory element 106 may instead be programmed to a second state, e.g. to a "0" state, e.g. to a high resistance value due to the anti-parallel alignment of free magnetic layer 432 with fixed magnetic layer 434.

First voltage, e.g. ERASE voltage, may be applied as follows: a voltage of 0 V may be applied to $BL_1$ 214A. A voltage of 0 V may be applied to $BL_2$ 214B. A voltage of 1.2 V may be applied to SL 226. A voltage of 1.5 V may be applied to WL 228.

Therefore, two-terminal memory elements 104, 106 may be arranged wherein each of two-terminal memory elements 104, 106 may be programmed to different states in response to the same applied voltage.

As shown in FIG. 4B, memory cell 202 may be configured to be programmed to a second bit value, e.g. a WRITE state, wherein a second voltage, e.g. a WRITE voltage, may be applied across first two-terminal memory element 104 and second two-terminal memory element 106. Second voltage, e.g. WRITE voltage, may be enabled as follows: a voltage of 1.2 V may be applied to $B_{L1}$ 214A. A voltage of 1.2 V may be applied to $B_{L2}$ 214B. A voltage of 0 V may be applied to SL 226. A voltage of 1.5 V may be applied to WL 228.

As one of first two-terminal memory element 104 and second two-terminal memory element 106 may be reverse connected with respect to the second voltage applied across the first two-terminal memory element and the second two-terminal memory element, first two-terminal memory element 104 may be programmed to a second state, e.g. to a high resistance value due to the anti-parallel alignment of free magnetic layer 432 with fixed magnetic layer 434, while second two-terminal memory element 106 may be programmed to a first state, e.g. to a low resistance value due to the parallel alignment of free magnetic layer 432 with fixed magnetic layer 434.

At least one access transistor 216 may be configured to control a current through first two-terminal memory element 104 and second two-terminal memory element 106. This may be carried by applying a corresponding voltage at word line 228.

FIG. 4C shows how a method for reading a bit value of memory cell 202.

Assuming memory cell 202 is programmed to an ERASE state as shown in FIG. 4C, first two-terminal memory element 104 may be programmed to a first state, e.g. to a low resistance value due to the parallel alignment of free magnetic layer 432 with fixed magnetic layer 434, while second two-terminal memory element 106 may be programmed to a second state, e.g. to a high resistance value due to the anti-parallel alignment of free magnetic layer 432 with fixed magnetic layer 434.

A READ voltage may be applied across first two-terminal memory element 104 and second two-terminal memory element 106. For example, a voltage of 0.1 V may be applied to $BL_1$ 214A. A voltage of 0.1 V may be applied to $BL_2$ 214B. A voltage of 0 V may be applied to SL 226. A voltage of 1.2 V may be applied to WL 228.

Therefore, current $I_1$ through first two-terminal memory element 104 may be different to a current $I_2$ through second two-terminal memory element 106. In this example, as first two-terminal memory element 104 may be at a low resistance value and second two-terminal memory element 106 may be at a high resistance value, current $I_1$ through first two-terminal memory element 104 may be larger than current $I_2$ through second two-terminal memory element 106.

A difference signal between first two-terminal memory element signal 438 associated with the state of the first two-terminal memory element 104 and second two-terminal memory element signal 442 associated with the state of the second two-terminal memory element may be measured (as in 320 of method 300).

First two-terminal memory element signal 438 and second two-terminal memory element signal 442 may each include a current signal.

Depending on the sign of the difference signal, an erased state or a written state may be detected. For example, if current difference $I_1$-$I_2$ may be a positive value, an ERASE state of memory cell 202 may be detected.

Assuming memory cell 202 is programmed to a WRITE state as shown in FIG. 4B, the READ voltage may be applied across first two-terminal memory element 104 and second two-terminal memory element 106. As first two-terminal memory element 104 may be programmed to a second state, e.g. to a high resistance value due to the anti-parallel alignment of free magnetic layer 432 with fixed magnetic layer 434, while second two-terminal memory element 106 may be programmed to a first state, e.g. to a low resistance value due to the parallel alignment of free magnetic layer 432 with fixed magnetic layer 434, therefore, first two-terminal memory element 104 may be at a high resistance value and second two-terminal memory element 106 may be at a low resistance value. Therefore, current $I_1$ through first two-terminal memory element 104 may be smaller than current $I_2$ through second two-terminal memory element 106. Therefore, current difference $I_1$-$I_2$ may be a negative value. Thus, a WRITE state in memory cell 202 is detected.

First voltage, e.g. ERASE voltage, second voltage, e.g. WRITE voltage, and READ voltage may not be restricted to the example values provided above. First voltage may be substantially equal and opposite to the second voltage.

In the application of first voltage, e.g. ERASE voltage, both bit lines $BL_1$ 214A and $BL_2$ 214B may have the same potential applied to them. A voltage ranging from about 0 V to about 0.1 V, e.g. about 0V, may be applied to $BL_1$ 214A. A voltage ranging from about 0 V to about 0.1 V, e.g. about 0V, may be applied to $BL_2$ 214B. A voltage ranging from about 0 V to about 0.1 V, e.g. about 0V, may be applied to SL 226. A voltage ranging from about 1 V to about 2 V, e.g. about 1.2 V to about 1.8V, e.g. about 1.3 V to about 1.5V, may be applied to WL 228.

In the application of second voltage, e.g. WRITE voltage, both bit lines $BL_1$ 214A and $BL_2$ 214B may have the same potential applied to them. A voltage ranging from about 1 V to about 5 V, e.g. about 1.5 V to about 4.5 V, e.g. about 3 V to about 4V, may be applied to $BL_1$ 214A. A voltage ranging from about 1 V to about 1.5 V, may be applied to $BL_2$ 214B. A voltage ranging from about 0 V to about 0.1 V, may be applied to SL 226. A voltage ranging from about 1 V to about 2 V, e.g. about 1.3 V to about 1.5 V, may be applied to WL 228.

In the application of READ voltage, both bit lines $BL_1$ 214A and $BL_2$ 214B may have the same voltage value, e.g. potential, applied to them. No disturbance is applied to neighboring cells. A voltage ranging from about 0.1 V to about 0.2 V, may be applied to $BL_1$ 214A. A voltage ranging from about 0.1 V to about 0.2 V, may be applied to $BL_2$ 214B. A voltage ranging from about 0 V to about 0.1 V, may be applied to SL 226. A voltage ranging from about 1 V to about 1.5 V, may be applied to WL 228.

As the bit-value of a single-bit memory cell 202 may be determined from a difference between the currents $I_1$, $I_2$, through the complementary states of first two-terminal memory element 104 and second two-terminal memory element 106, instead of comparing the absolute current to a reference level between the two current levels, the READ window to read a state of the memory cell may be doubled. The current difference may be measured between bit linE $B_{L1}$ 214A and bit linE $B_{L2}$ 214B.

Figure 5:
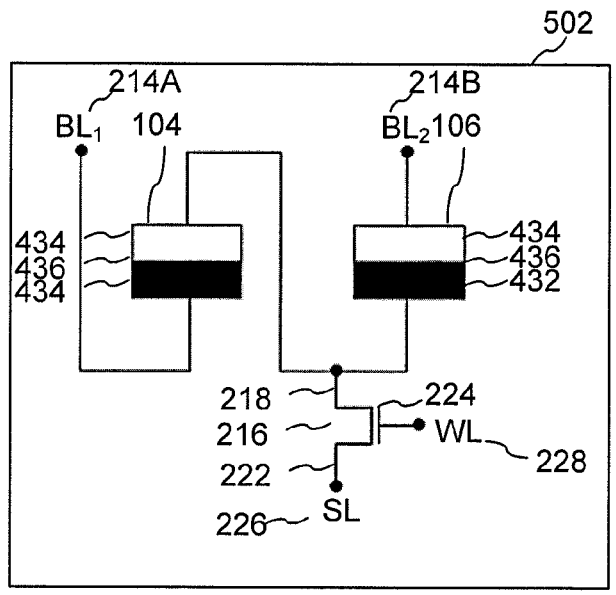
FIG. 5 shows a memory cell according to an embodiment.

FIG. 5 shows memory cell 502 according to an embodiment. Memory cell 502 may include memory cell 202 described above with respect to FIG. 2. The basic functionalities of all the features described with respect to memory cell 102 and 202 are applicable to memory cell 502. Methods 300 and 400 for operating a memory cell, e.g. memory cell 202 may also be used to operate memory cell 502.

Memory cell 502 may include all the features described with respect to memory cell 202. Memory cell 502 may include first two-terminal memory element 104, second two-terminal memory element 106, controller circuit 108 and measuring circuit 112.

As with memory cell 202, first two-terminal memory element 104 and second two-terminal memory element 106 may be configured to be programmed interdependently. In other words, a state of second two-terminal memory element 106 depends on a state of first two-terminal memory element 104, and vice versa. First two-terminal memory element 104 and second two-terminal memory element 106 may be programmed to different, e.g. opposite, states in response to a voltage applied across first two-terminal memory element 106 and second two-terminal memory element 106. In other words, two inverse conditions are always saved in first two-terminal memory element 104 and second two-terminal memory element 106, and a differential reading may be determined.

In FIG. 5, one of first two-terminal memory element 104 and second two-terminal memory element 106 may be reverse connected. Bit line BL1 214A may be electrically coupled to free magnetic layer 432 of first two-terminal memory element 104 and fixed magnetic layer 434 of second two-terminal memory element 106. At least one access transistor 216 may be electrically coupled to fixed magnetic layer 434 of first two-terminal memory element 104 and free magnetic layer 432 of second two-terminal memory element 106.

In FIG. 5, first two-terminal memory element 104 and second two-terminal memory element 106 may be oriented in the same direction, e.g. first two-terminal memory element 104 and second two-terminal memory element 106 may face the same direction. The electrical connectors, e.g. wires, connecting first two-terminal memory element 104 and second two-terminal memory element 106 may be arranged such that one of first two-terminal memory element 104 and second two-terminal memory element 106 is reverse connected.

In FIG. 5, one of first two-terminal memory element 104 and second two-terminal memory element 106 may be reverse connected with respect to a voltage applied across first two-terminal memory element 104 and second two-terminal memory element 106. In other words, when a voltage is applied between first two-terminal memory element 104 and second two-terminal memory element 106, a potential between free magnetic layer 432 and fixed magnetic layer 434 of first two-terminal memory element 104 may be +X, whereas, a potential between free magnetic layer 432 and fixed magnetic layer 434 of second two-terminal memory element 104 may be –X, i.e. substantially equal and opposite to the potential between free magnetic layer 432 and fixed magnetic layer 434 of first two-terminal memory element 104.

Figure 6:
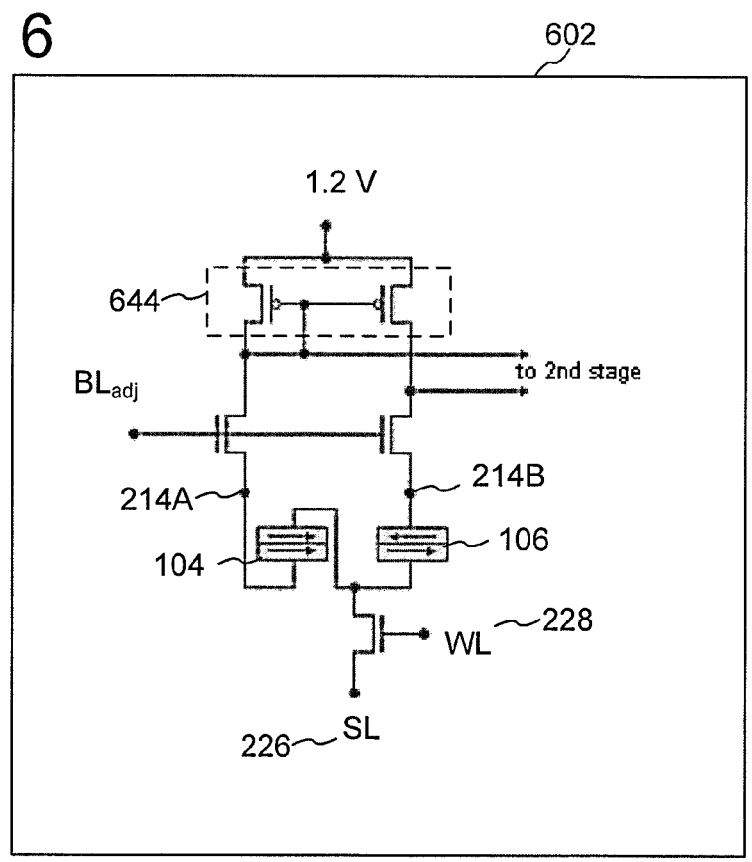
FIG. 6 shows a read circuit according to an embodiment.

FIG. 6 shows a read circuit 602 of a memory cell according to an embodiment. The memory cell may include memory cell 202 described above with respect to FIG. 2. The memory cell may include memory cell 502 described above with respect to FIG. 5. The memory cell may include the basic functionalities of all the features described with respect to memory cells 102, 202, 502. Methods 300 and 400 may also be used to operate the memory cell.

In read circuit 602, at least one access transistor 216 may include first access transistor 216A electrically coupled to first two-terminal memory element 104; and second access transistor 216B electrically coupled to second two-terminal memory element 106.

First access transistor 216A may be configured to control a current through first two-terminal memory element 104 and second access transistor 216B may be configured to control a current through second two-terminal memory element 106.

The memory cell of read circuit 602 may include measuring circuit 112, wherein measuring circuit 112 may include a differential amplifier 644. Differential amplifier 644 may evaluate a difference between the currents $I_1$, $I_2$, through first two-terminal memory element 104 and second two-terminal memory element 106, e.g. the difference may be measured between bit line $BL_1$ 214A and bit line $BL_2$ 214B.

Figure 7:
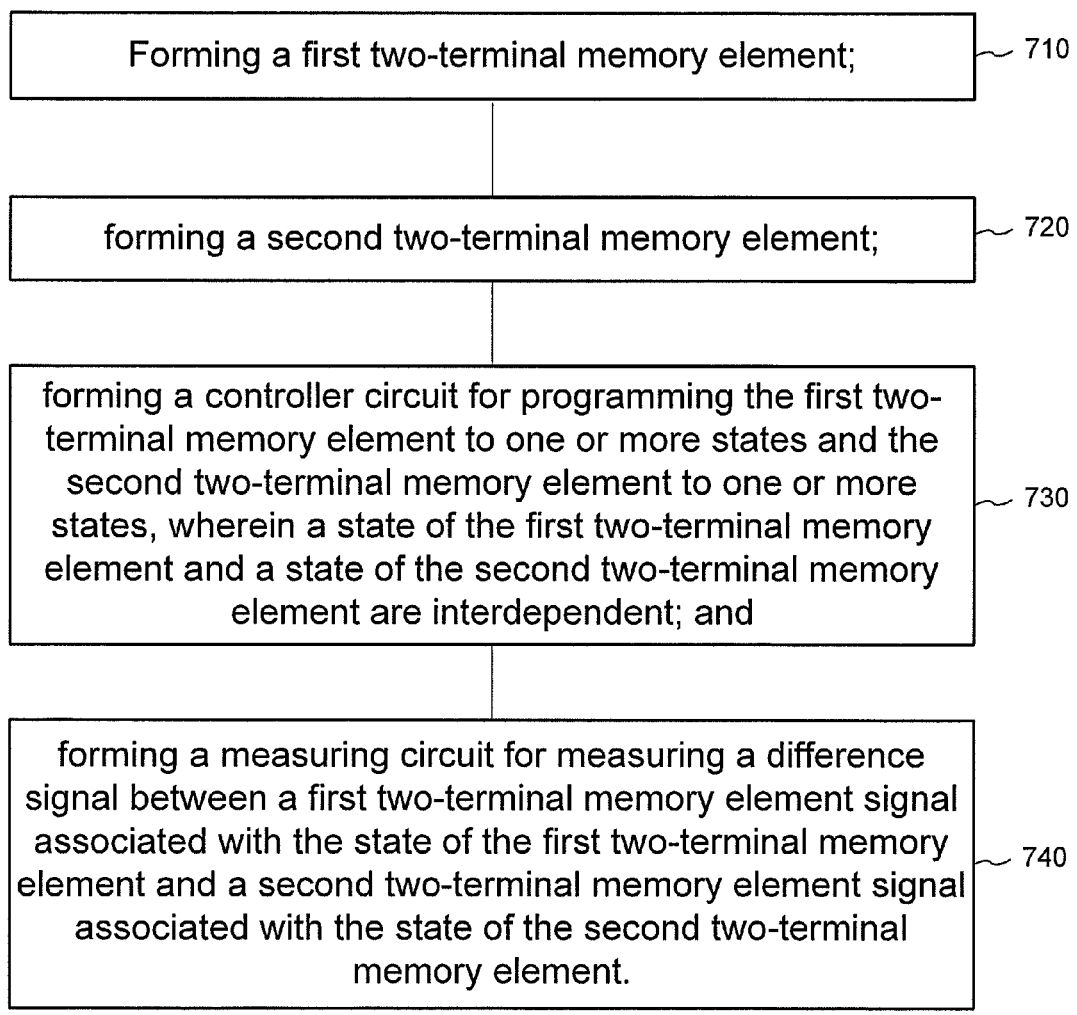
FIG. 7 shows a method for forming a memory cell according to an embodiment.

FIG. 7 shows a method 700 for forming a memory cell according to an embodiment. Method 700 may include:
  forming a first two-terminal memory element (in 710);
  forming a second two-terminal memory element (in 720);
  forming a controller circuit for programming the first two-terminal memory element to one or more states and the second two-terminal memory element to one or more states, wherein a state of the first two-terminal memory element and a state of the second two-terminal memory element are interdependent (in 730); and
  forming a measuring circuit for measuring a difference signal between a first two-terminal memory element signal associated with the state of the first two-terminal memory element and a second two-terminal memory element signal associated with the state of the second two-terminal memory element (in 740).

Method 700 may further include reverse connecting one of the first two-terminal memory element and the second two-terminal memory element with respect to a voltage applied across the first two-terminal memory element and the second two-terminal memory element.

Figure 8:
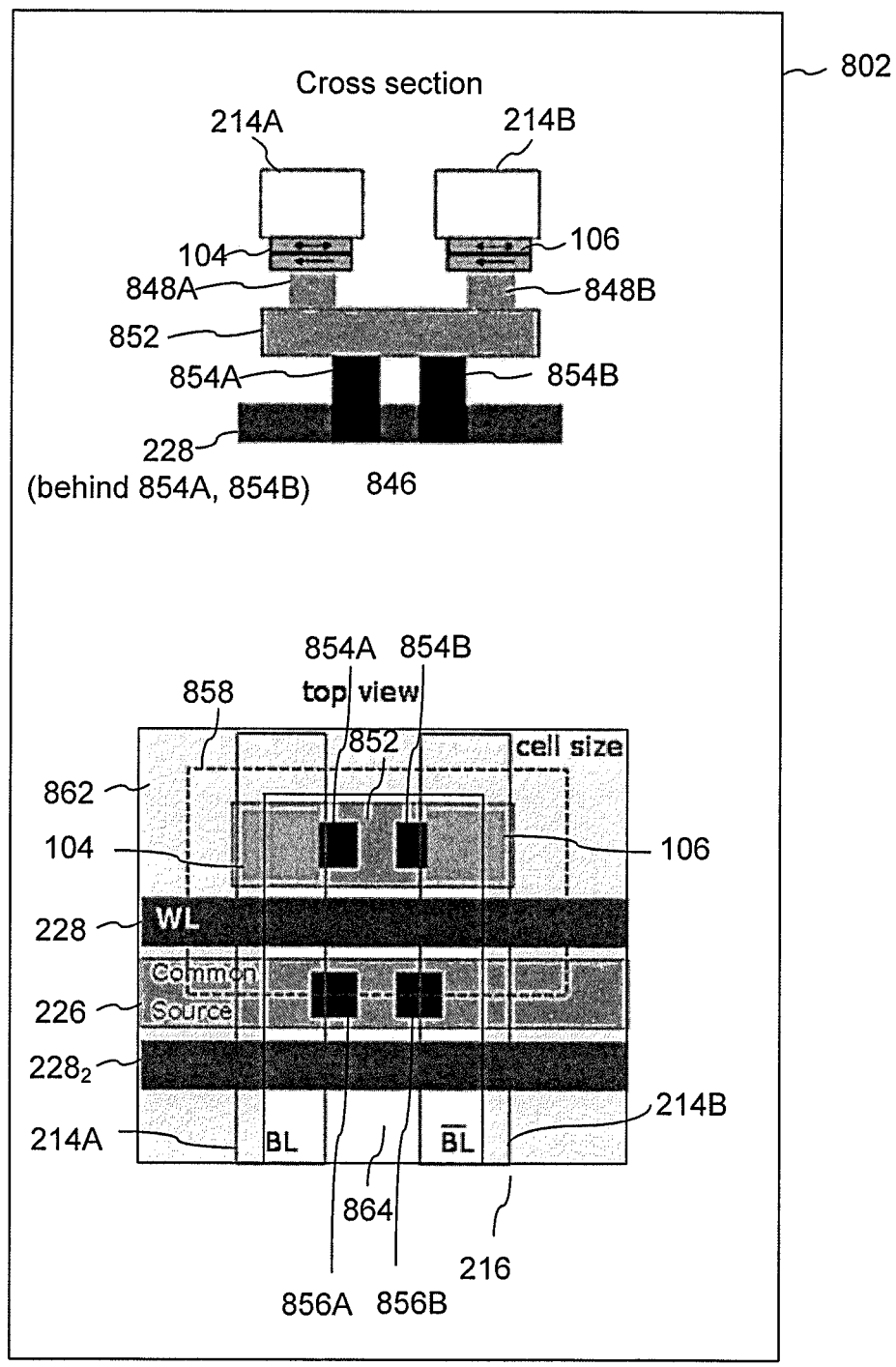
FIG. 8 shows a memory cell according to an embodiment.

FIG. 8 shows memory cell 802 according to an embodiment. Memory cell 802 described according to FIG. 8 may include any of memory cells 102, 202, 502, already described above. FIG. 8 shows a cross-section and a top view of memory cell 802. Memory cell 802 may be formed over carrier 846. Carrier 846 may include a silicon substrate.

First two-terminal memory element 104 and second two-terminal memory element 106 may each be electrically coupled between at least one bit line, e.g. bit lines 214A, 214B, and at least one access transistor 216. First two-terminal memory element 104 may be electrically coupled between bit line $BL_1$ 214A and at least one access transistor 216. Second two-terminal memory element 104 may be electrically coupled between bit line $BL_2$ 21BA and at least one access transistor 216.

Each of bit lines 214A, 214B may include an electrically conductive line, e.g. a metal line, e.g. a metal line including Cu, Al, e.g. a liner material, e.g. Ti, TiN, Ta. Bit lines 214A 214B may be arranged substantially parallel to each other. Bit lines 214A 214B may be arranged above, e.g. over, first two-terminal memory element 104 and second two-terminal memory element 106. Bit lines 214A 214B may be arranged as part of an array of substantially parallel bit lines $BL_1$, $BL_2$, ... $BL_n$.

First two-terminal memory element 104 and second two-terminal memory element 106 may each be electrically connected to at least one access transistor 216 via electrical connections. First two-terminal memory element 104 and second two-terminal memory element 106 may each be electrically connected to at least one access transistor 216 from a side opposite to where the bit lines are arranged, e.g. from under first two-terminal memory element 104 and second two-terminal memory element 106. Electrical connections may include vias 848A, 848B, electrically conductive material 852, e.g. a metal, e.g. Cu, A; liner material, e.g. Ti TiN, Ta, and electrical connections, e.g. electrical contacts, 854A, 854B. Electrically conductive material 852 may include a bypass electrically conductive line, e.g. a bypass metallic line. As first two-terminal memory element 104 and second two-terminal memory element 106 may each be electrically connected to source/drain region 218 of at least one access transistor 216, first two-terminal memory element 104 and second two-terminal memory element 106 may each be electrically connected to source/drain region 218 via the electrical connections, including vias 848A, 848B, electrically conductive material, e.g. metal 852, and electrical connections 854A, 854B. The layers, e.g. levels, in which first two-terminal memory element 104 and second two-terminal memory element 106 may be found may be shifted to a higher level, through stacked via structures, e.g. vias 848A, 848B.

Figure 9:
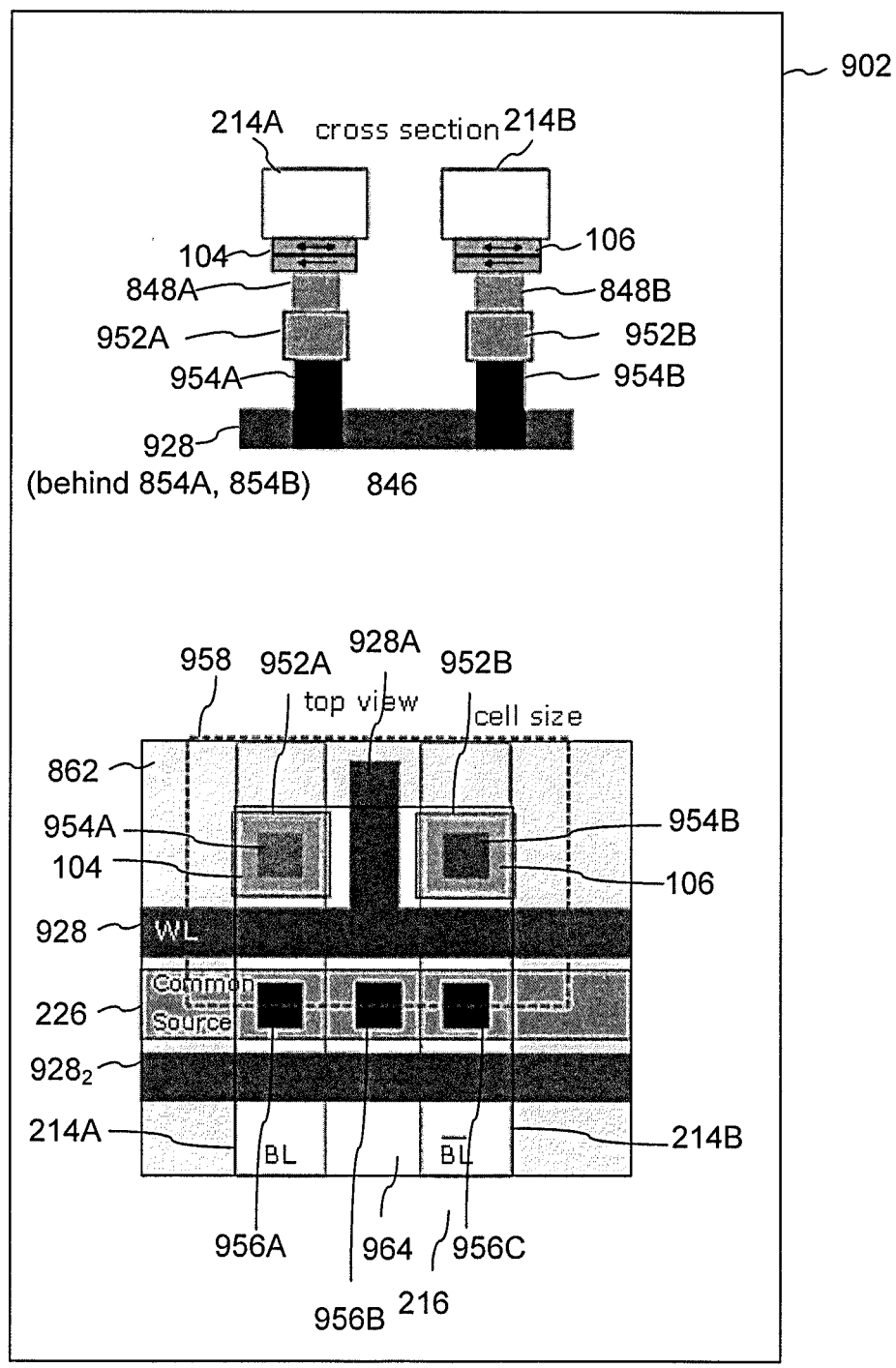
FIG. 9 shows a memory cell according to an embodiment.

Word line 228 which may be connected to gate region 224 of at least one access transistor 216 is shown in the background of electrical contacts 854A, 854B. Source/drain region 218 of at least one access transistor 216 may include a common source/drain region electrically coupled to first two-terminal memory element 104 and second two-terminal memory element 106. Word line 228 may be arranged substantially perpendicular to bit lines 214A, 214B. Word line 228 may be arranged as part of an array of substantially parallel word lines $WL_1$, $WL_2$, $WL_n$. A further word line $WL_2$ $228_2$ neighboring word line 228 is shown in FIG. 9. Word lines 228 may be isolated from bit lines 214A, 214B, as word lines 228 may be arranged on a different level from bit lines 214A, 214B, e.g. Word line 228 may be arranged below first two-terminal memory element 104 and second two-terminal memory element 106.

Source lines 228, e.g. $SL_1$, $SL_2$, ... $SL_n$, may be arranged substantially parallel to bit lines 214, e.g. $BL_1$, $BL_2$, ... $BL_n$. According to alternative embodiments, Source lines 228, e.g. $SL_1$, $SL_2$, ... $SL_n$, may be arranged substantially perpendicular to bit lines 214, e.g. $BL_1$, $BL_2$, ... $BL_n$. This may save area, e.g. reduce the area of the cell, as the metallic bypass line 852 may be formed between the first two-terminal memory element 104 and second two-terminal memory element 106. Word lines 228, e.g. $W_{L1}$, $WL_2$, ... $WL_n$, may be arranged substantially perpendicular to bit lines 214 e.g. $BL_1$, $BL_2$, ... $BL_n$.

One or more electrical contacts 854A, 854B may be configured to connect source line 226 in active area/diffusion area 864 with electrically conductive material 852 in an above level. First source/drain region 218 may be arranged close to word line 228.

One or more isolation regions 862, e.g. shallow trench isolation STI regions, may be arranged between bit lines 214, e.g. $BL_1$, $BL_2$, ... $BL_n$.

One or more electrical contacts 856A, 856B, may be configured to electrically contact source line 226 to electrically conductive material 852.

Size of memory cell 802 may be defined by cell size 858. A cell size of less than 35 $F^2$ may be achieved (F: feature size of corresponding technology node), which, as opposed to classical FLASH cells, fully impacts the logic shrink path.

FIG. 9 shows memory cell 902 according to an embodiment. FIG. 9 shows a cross-section and a top view of memory cell 902. Memory cell 902 described according to FIG. 9 may include all the features and functionalities of memory cell 802, except for modifications to the following features. Word line 228 may be modified to word line 928. Word line 928 may include all the features and functionalities of word line 228, except that word line 928 may include an extension region 928A configured to extend through electrically conductive material 852, e.g. bypass line. In other words, electrically conductive material 852 of memory cell 802 may be modified such that electrically conductive material 952 is separated into two separate parts 952A, 952B. Electrically conductive material parts 952A, 952B may include all the functionalities and features of electrically conductive material 852, except for the above-mentioned modification. Word line 928 and word line extension region 928A may be configured to overlap the active areas 964 at the top of the cell. Word line extension region 928A may extend between electrically conductive material part 952A and electrically conductive material part 952B. A modified access transistor 216 between two separated drain regions may switch off currents from a first bit lines through both first two-terminal memory element 104 and second two-terminal memory element 106, to the other bit lines on unselected word lines. One or more electrical contacts 956A, 956B, 956C may be configured to electrically contact source line 226 to electrically conductive materials 952A, 952B. Similarly, word line 228$_2$ may be modified to 928$_2$ to include all the features and functionalities described with respect to word line 928. Size of memory cell 902 may be defined by cell size 958. Memory cell 902 may include at least one access transistor 216 including first source/drain region 218; second source/drain region 222; and gate region 224, wherein gate region 224 may be electrically coupled to word line 928 of memory cell 902; wherein word line 928 comprises word line body region 928 and word line extension region 928A configured at an angle to word line body region 928, wherein word line extension region 928A may be arranged between first two-terminal memory element 104 and second two-terminal memory element 106. The angle between word line extension region 928A word line body region 928 may range from about 0° to about 180°, e.g. about 30° to about 150°, e.g. about 80° to about 100°. Word line extension region 928A may comprise a further access transistor (not shown), e.g. word line extension region 928A may form a further access transistor, configured to isolate a source/drain region electrically coupled to the first two-terminal memory element from a source/drain region electrically coupled to the second two-terminal memory element. According to an embodiment, word line extension region 928A may form a further access transistor, configured to isolate a drain region, e.g. drain region 218A, electrically coupled to the first two-terminal memory element from a drain region, e.g. drain region 218B, electrically coupled to the second two-terminal memory element.

Figure 10:
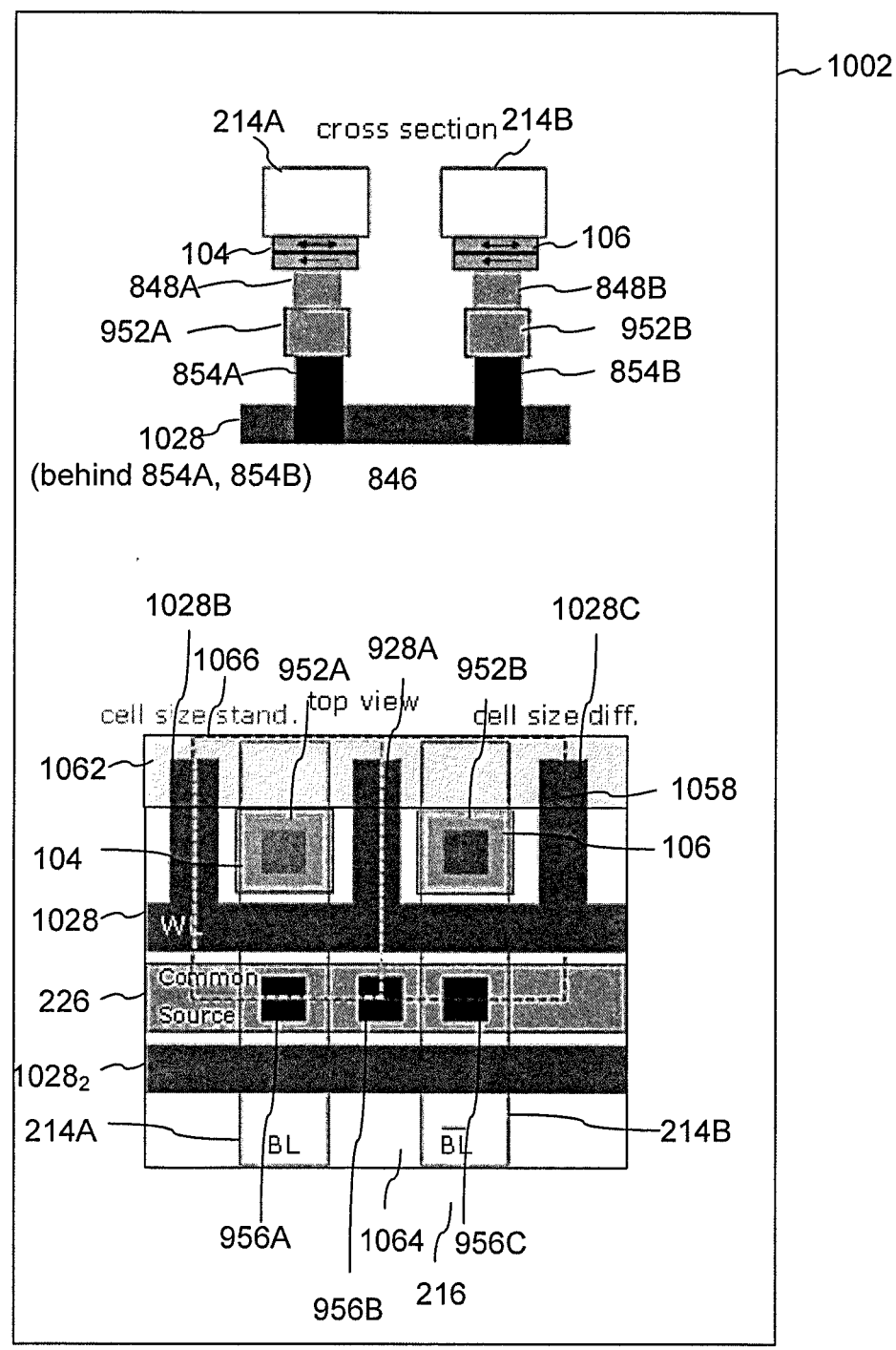
FIG. 10 shows a memory cell according to an embodiment.

FIG. 10 shows memory cell 1002 according to an embodiment. FIG. 10 shows a cross-section and a top view of memory cell 1002. Memory cell 1002 described according to FIG. 10 may include all the features and functionalities of at least one of memory cells 902, except for modifications to the following features. Isolation regions 962, e.g. STI isolation regions, between bit lines 214A, 214B, and neighboring bit lines, may be replaced by gate polysilicon to increase the active width of the selected word line 928 even more during programming. In other words, word line 928 may be modified to word line 1028, wherein in addition to extension region 1028A, word line 1028 may include further extension regions 1028B, 1028C arranged between bit lines 214A, 214B and neighboring bit lines. Word line extension region 1028A and further extension regions 1028B, 1028C may be configured to overlap the active areas 1064 at the top of the cell. Size of memory cell 1002 may be defined by cell size 1058. This concept may be applied by non-differential cell arrays, e.g a single cell memory cell arrangement with only a single memory element denoted by cell size 1066. Similarly, word line 928$_2$ may be modified to 1028$_2$ to include all the features and functionalities described with respect to word line 1028.

The differential sensing concept as described according to various embodiments with respect to memory cells 102, 202, 502 and further with respect to methods 300 and 400 may be applied wherein first two-terminal memory element 104 and second two-terminal memory element 106 may be arranged in separated, e.g. different, bit cells. However, this may have larger area requirements.

Figure 11:
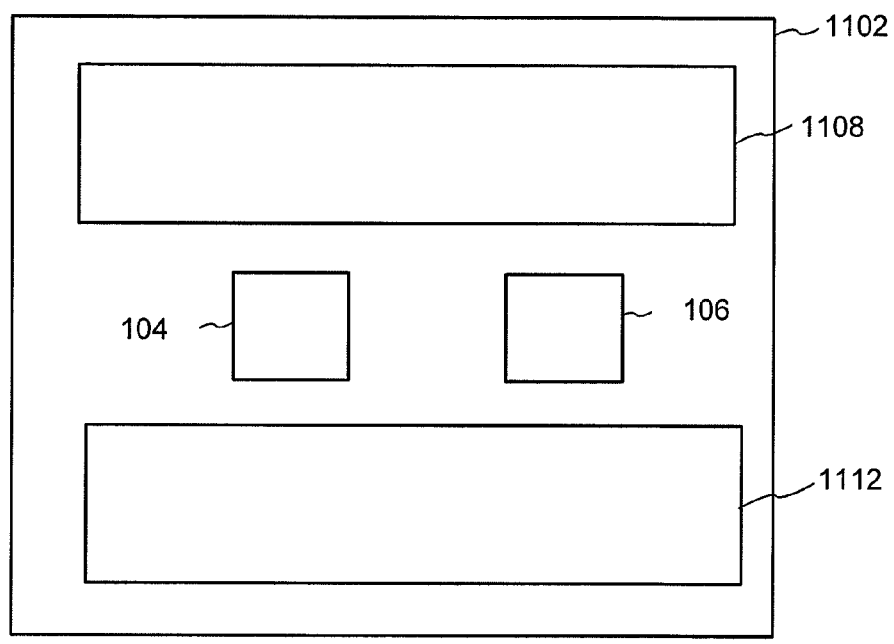
FIG. 11 shows a memory cell according to an embodiment.

FIG. 11 shows memory cell 1102 according to an embodiment. Memory cell 1102 may include first two-terminal memory element 104; second two-terminal memory element 106; controller circuit 1108; and measuring circuit 1112, wherein controller circuit 1108 and measuring circuit 1112 may be configured to operate in a first mode or a second mode; and wherein in the first mode, controller circuit 1108 may be configured to program first two-terminal memory element 104 to one or more states and second two-terminal memory element 106 to one or more states, wherein a state of first two-terminal memory element 104 and a state of second two-terminal memory element 106 are interdependent; and measuring circuit 1112 may be configured to measure a difference signal between first two-terminal memory element signal associated with the state of first two-terminal memory element 104 and a second two-terminal memory element signal associated with the state of second two-terminal memory element 106; and wherein in the second mode controller circuit 1108 may be configured to program one of first two-terminal memory element 104 and second two-terminal memory element 106 to one or more states; and measuring circuit 1112 may be configured to measure a signal in one of first two-terminal memory element 104 and the second two-terminal memory element 106 associated with the state of the one of the first two-terminal memory element and the second two-terminal memory element.

Memory cell 1102 may include the basic functionalities of all the features described with respect to any one of memory cells 102, 202, 502, 802, 902, 1002, which as described above, may be configured to operate in a first mode, i.e. in differential mode. In other words each of memory cells 102, 202, 502, 802, 902, 1002 may be further configured to operate in a further mode, i.e. the second mode, wherein controller circuit 1108 may be further configured to program one of first two-terminal memory element 104 and second two-terminal memory element 106 to one or more states; and measuring circuit 1112 may be further configured to measure a signal in one of first two-terminal memory element 104 and the second two-terminal memory element 106 associated with the state of the one of the first two-terminal memory element and the second two-terminal memory element.

Memory cell 1102 may include a normal connected cell, e.g. first two-terminal memory element 104 and a reverse connected cell, e.g. second two-terminal memory element 106, wherein memory cell 1102 may include a select device, e.g. an access transistor 216. Memory cell 1102 may be configured to operate in a first mode and in a second mode, e.g. with two read modes. For high speed memory applications, memory cell 1102 may be configured to operate in the first mode, i.e. the differential sensing mode, and controller circuit 1108 and measuring circuit 1112 may be configured to operate in the first mode as described above with respect to memory cells 102, 202, 502, 802, 902, 1002, i.e. using a pair of one normal memory element 104 and one reverse-connected memory element 104 for "WRITE" and "READ" per bit. For high density requirements, e.g. slower speed sensing memory applications, memory cell 1102 may be configured to operate in the second mode, i.e. the further mode, and controller circuit 1108 and measuring circuit 1112 may be configured to operate in the second mode, wherein a single memory element, e.g. first two-terminal memory element 104 or second two-terminal memory element 106, for "WRITE" and "READ" per bit may be used.

Various embodiments provide a memory cell, including a first two-terminal memory element; a second two-terminal memory element; a controller circuit configured to program the first two-terminal memory element to one or more states and the second two-terminal memory element to one or more states, wherein a state of the first two-terminal memory element and a state of the second two-terminal memory element are interdependent; and a measuring circuit configured to measure a difference signal between a first two-terminal memory element signal associated with the state of the first two-terminal memory element and a second two-terminal memory element signal associated with the state of the second two-terminal memory element.

According to an embodiment, the controller circuit is configured to program the first two-terminal memory element and the second two-terminal memory element to different states.

According to an embodiment, the controller circuit is configured to program interdependently the first two-terminal memory element to a first state and the two-terminal memory element to a second state, and to program interdependently the first two-terminal memory element to a second state and the two-terminal memory element to a first state.

According to an embodiment, the first two-terminal memory element signal and the second two-terminal memory element signal each includes a current signal.

According to an embodiment, the first two-terminal memory element and the second two-terminal memory element are arranged such that the first two-terminal memory element and the second two-terminal memory element are programmed to different states in response to a voltage applied across the first two-terminal memory element and the second two-terminal memory element.

According to an embodiment, the first state includes a first resistance value and the second state includes a second resistance value, wherein the first resistance value is different from the second resistance value.

According to an embodiment, the memory cell includes a single bit memory cell.

According to an embodiment, the memory cell is configured to be programmed to a first bit value wherein the first two-terminal memory element is programmed to a first state and the two-terminal memory is programmed to a second state, and wherein is configured to be programmed to a second bit value wherein the first two-terminal memory element is programmed to a second state and the two-terminal memory element is programmed to a first state.

According to an embodiment, the memory cell is configured to be programmed to a first bit value wherein a first voltage is applied across the first two-terminal memory element and the second two-terminal memory element, and wherein the memory cell is configured to be programmed to a second bit value wherein a second voltage is applied across the first two-terminal memory element and the second two-terminal memory element.

According to an embodiment, the first voltage is equal and opposite to the second voltage.

According to an embodiment, one of the first two-terminal memory element and the second two-terminal memory element is reverse connected with respect to a voltage applied across the first two-terminal memory element and the second two-terminal memory element.

According to an embodiment, the first two-terminal memory element and the second two-terminal memory element are electrically coupled between at least one bit line and at least one access transistor.

According to an embodiment, the at least one access transistor includes a first access transistor electrically coupled to the first two-terminal memory element; and a second access transistor electrically coupled to the second two-terminal memory element.

According to an embodiment, the at least one access transistor is configured to control a current through the first two-terminal memory element and the second two-terminal memory element, wherein the difference between the currents through the first two-terminal memory element and the second two-terminal memory element determines the bit value of the memory cell.

According to an embodiment, the memory cell further includes at least one access transistor including: a first source/drain region; a second source/drain region; and a gate region; wherein the first source/drain region is electrically coupled to the first two-terminal memory element and the second two-terminal memory element; wherein the second source/drain region is electrically coupled to a source line of the memory cell; and wherein the gate region is electrically coupled to a word line of the memory cell.

According to an embodiment, the first two-terminal memory element and the second two-terminal memory element each includes a magnetoresistive random access two-terminal memory element.

According to an embodiment, the first two-terminal memory element and the second two-terminal memory element each includes a magnetic tunnel junction stack; wherein the magnetic tunnel junction stack includes a free magnetic layer; and a fixed magnetic layer separated from the free magnetic layer by an isolation layer.

According to an embodiment, at least one bit line is electrically coupled to the free magnetic layer of the first two-terminal memory element and the fixed magnetic layer of the second two-terminal memory element; and wherein at least one access transistor is electrically coupled to the fixed magnetic layer of the first two-terminal memory element and the free magnetic layer of the second two-terminal memory element.

According to an embodiment, the first two-terminal memory element and second two-terminal memory element each includes a conductive bridging random access memory element.

According to an embodiment, the first two-terminal memory element and second two-terminal memory element each includes a resistive random access memory element.

According to an embodiment, the memory cell includes at least one access transistor including a first source/drain region; a second source/drain region; and a gate region, wherein the gate region may be electrically coupled to a word line of the memory cell; wherein the word line comprises a word line body region and a word line extension region configured at an angle to the word line body region, wherein the word line extension region is arranged between the first two-terminal memory element and the second two-terminal memory element.

According to an embodiment, the word line extension region forms a further access transistor configured to isolate a source/drain region electrically coupled to the first two-terminal memory element from a source/drain region electrically coupled to the second two-terminal memory element;

Various embodiments provide a method for forming a memory cell, the method including: forming a first two-terminal memory element; forming a second two-terminal memory element; and forming a controller circuit for programming the first two-terminal memory element to one or more states and the second two-terminal memory element to one or more states, wherein a state of the first two-terminal memory element and a state of the second two-terminal memory element are interdependent; and forming a measuring circuit for measuring a difference signal between a first two-terminal memory element signal associated with the state of the first two-terminal memory element and a second two-terminal memory element signal associated with the state of the second two-terminal memory element.

According to an embodiment, the method further includes reverse connecting one of the first two-terminal memory element and the second two-terminal memory element with respect to a voltage applied across the first two-terminal memory element and the second two-terminal memory element.

Various embodiments provide a memory cell, including a first two-terminal memory element; a second two-terminal memory element; a controller circuit; and a measuring circuit, wherein the controller circuit and the measuring circuit may be configured to operate in a first mode or a second mode; and wherein in the first mode, the controller circuit may be configured to program the first two-terminal memory element to one or more states and the second two-terminal memory element to one or more states, wherein a state of the first two-terminal memory element and a state of the second two-terminal memory element are interdependent; and the measuring circuit may be configured to measure a difference signal between a first two-terminal memory element signal associated with the state of the first two-terminal memory element and a second two-terminal memory element signal associated with the state of the second two-terminal memory element; and wherein in the second mode the controller circuit may be configured to program one of the first two-terminal memory element and the second two-terminal memory element to one or more states; and the measuring circuit may be configured to measure a signal in one of the first two-terminal memory element and the second two-terminal memory element associated with the state of the one of the first two-terminal memory element and the second two-terminal memory element.

Various embodiments provide a method for operating a memory cell, the method including: programming a first two-terminal memory element to one or more states and a second two-terminal memory element to one or more states, wherein a state of the first two-terminal memory element and a state of the second two-terminal memory element are interdependent; and measuring a difference signal between a first two-terminal memory element signal associated with the state of the first two-terminal memory element and a second two-terminal memory element signal associated with the state of the second two-terminal memory element.

MRAM and RRAM cells are characterized by good shrink properties, which are considered to be very critical in the classical FLASH concept (less than 40 nm) because of the required high voltages.

Various embodiments provide a memory cell wherein the difference between the inverse states, e.g. different states, of two electrically coupled two-terminal memory cells may be evaluated instead of the absolute current in the memory cell. No additional reference currents and no additionally dedicated global reference cells are required.

Various embodiments provide a memory cell wherein a local reference may be provided in the memory cell, wherein matching properties may be clearly improved without doubling the memory cell area. As relatively high currents, e.g. greater than 100 µA, are required in MRAM cells and RRAM cells, a relatively wider select transistor, i.e. access transistor, is usually required. Therefore, the cell area may be determined by the transistor and through the second memory element in the metallization. The inclusion of a second memory element contributes to a small area increase. The memory cell will not be significantly larger, but clearly more robust.

The READ window to read a state of the memory cell is doubled compared with conventional single-MTJ cells. The READ signal window may be clearly increased and the system may be more robust towards a shift of the read window after cycles, hot storage, and towards fluctuations in the physical properties of memory materials. Various embodiments for non-volatile memory applications include their use in reliability-critical automotive applications, and endurance-critical chip card applications.

Due to the location of the second memory cell in direct electrical connection with the first memory cell, the resistance variation between the two memory elements caused by long range magnetic layer variation will be very low which will improve the READ window even more.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory cell, comprising:
a first two-terminal memory element;
a second two-terminal memory element;
a controller circuit configured to program the first two-terminal memory element to one or more states and the second two-terminal memory element to one or more states, wherein a state of the first two-terminal memory element and a state of the second two-terminal memory element are interdependent; and
a measuring circuit configured to measure a difference signal between a first two-terminal memory element signal associated with the state of the first two-terminal memory element and a second two-terminal memory element signal associated with the state of the second two-terminal memory element.

2. The memory cell according to claim 1,
wherein the controller circuit is configured to program the first two-terminal memory element and the second two-terminal memory element to different states.

3. The memory cell according to claim 1,
wherein the controller circuit is configured to program interdependently the first two-terminal memory element to a first state and the two-terminal memory element to a second state, and to program interdependently the first two-terminal memory element to a second state and the two-terminal memory element to a first state.

4. The memory cell according to claim 1, wherein the first two-terminal memory element signal and the second two-terminal memory element signal each comprises a current signal.

5. The memory cell according to claim 1, wherein the first two-terminal memory element and the second two-terminal memory element are arranged such that the first two-terminal memory element and the second two-terminal memory element are programmed to different states in response to a voltage applied across the first two-terminal memory element and the second two-terminal memory element.

6. The memory cell according to claim 3, wherein the first state comprises a first resistance value and the second state comprises a second resistance value, wherein the first resistance value is different from the second resistance value.

7. The memory cell according to claim 1, wherein the memory cell comprises a single bit memory cell.

8. The memory cell according to claim 1, wherein the memory cell is configured to be programmed to a first bit value wherein the first two-terminal memory element is programmed to a first state and the two-terminal memory is programmed to a second state, and wherein the memory cell is configured to be programmed to a second bit value wherein the first two-terminal memory element is programmed to a second state and the two-terminal memory element is programmed to a first state.

9. The memory cell according to claim 1, wherein the memory cell is configured to be programmed to a first bit value wherein a first voltage is applied across the first two-terminal memory element and the second two-terminal memory element, and wherein the memory cell is configured to be programmed to a second bit value wherein a second voltage is applied across the first two-terminal memory element and the second two-terminal memory element.

10. The memory cell according to claim 9, wherein the first voltage is equal and opposite to the second voltage.

11. The memory cell according to claim 1, wherein one of the first two-terminal memory element and the second two-terminal memory element is reverse connected with respect to a voltage applied across the first two-terminal memory element and the second two-terminal memory element.

12. The memory cell according to claim 11, wherein the first two-terminal memory element and the second two-terminal memory element are electrically coupled between at least one bit line and at least one access transistor.

13. The memory cell according to claim 12, wherein the at least one access transistor comprises a first access transistor electrically coupled to the first two-terminal memory element; and a second access transistor electrically coupled to the second two-terminal memory element.

14. The memory cell according to claim 12, wherein the at least one access transistor is configured to control a current through the first two-terminal memory element and the second two-terminal memory element, wherein the difference between the currents through the first two-terminal memory element and the second two-terminal memory element determines the bit value of the memory cell.

15. The memory cell according to claim 1, further comprising
at least one access transistor comprising:
a first source/drain region;
a second source/drain region; and
a gate region;
wherein the first source/drain region is electrically coupled to the first two-terminal memory element and the second two-terminal memory element;
wherein the second source/drain region is electrically coupled to a source line of the memory cell; and
wherein the gate region is electrically coupled to a word line of the memory cell.

16. The memory cell according to claim 1, wherein the first two-terminal memory element and the second two-terminal memory element each comprises a magnetoresistive random access two-terminal memory element.

17. The memory cell according to claim 1, wherein the first two-terminal memory element and the second two-terminal memory element each comprises a magnetic tunnel junction stack; wherein
the magnetic tunnel junction stack comprises
a free magnetic layer;
and a fixed magnetic layer separated from the free magnetic layer by an isolation layer.

18. The memory cell according to claim 17, wherein at least one bit line is electrically coupled to the free magnetic layer of the first two-terminal memory element and the fixed magnetic layer of the second two-terminal memory element; and
wherein at least one access transistor is electrically coupled to the fixed magnetic layer of the first two-terminal memory element and the free magnetic layer of the second two-terminal memory element.

19. The memory cell according to claim 1, wherein the first two-terminal memory element and second two-terminal memory element each comprises a conductive bridging random access memory element.

20. The memory cell according to claim 1, wherein the first two-terminal memory element and second two-terminal memory element each comprises a resistive random access memory element.

21. The memory cell according to claim 1, further comprising
at least one access transistor comprising:
a first source/drain region;
a second source/drain region; and
a gate region;
wherein the gate region is electrically coupled to a word line of the memory cell;
wherein the word line comprises a word line body region and a word line extension region configured at an angle to the word line body region, wherein the word line extension region is arranged between the first two-terminal memory element and the second two-terminal memory element.

22. The memory cell according to claim 21, wherein the word line extension region forms a further access transistor configured to isolate a source/drain region electrically coupled to the first two-terminal memory element from a source/drain region electrically coupled to the second two-terminal memory element.

23. A memory cell, comprising:
a first two-terminal memory element;
a second two-terminal memory element;
a controller circuit; and
a measuring circuit,
wherein the controller circuit and the measuring circuit are configured to operate in a first mode or a second mode;
wherein in the first mode, the controller circuit is configured to program the first two-terminal memory element to one or more states and the second two-terminal memory element to one or more states, wherein a state of the first two-terminal memory element and a state of the second two-terminal memory element are interdependent; and the measuring circuit is configured to measure a difference signal between a first two-terminal memory element signal associated with the state of the first two-terminal memory element and a second two-terminal memory element signal associated with the state of the second two-terminal memory element; and
wherein in the second mode the controller circuit is configured to program one of the first two-terminal memory element and the second two-terminal memory element to one or more states; and the measuring circuit is configured to measure a signal in one of the first two-terminal memory element and the second two-terminal memory element associated with the state of the one of the first two-terminal memory element and the second two-terminal memory element.

24. A method for forming a memory cell, the method comprising:
forming a first two-terminal memory element;
forming a second two-terminal memory element; and
forming a controller circuit for programming the first two-terminal memory element to one or more states and the second two-terminal memory element to one or more states, wherein a state of the first two-terminal memory element and a state of the second two-terminal memory element are interdependent; and
forming a measuring circuit for measuring a difference signal between a first two-terminal memory element signal associated with the state of the first two-terminal memory element and a second two-terminal memory element signal associated with the state of the second two-terminal memory element.

25. The method according to claim 24, further comprising:
reverse connecting one of the first two-terminal memory element and the second two-terminal memory element with respect to a voltage applied across the first two-terminal memory element and the second two-terminal memory element.

26. A method for operating a memory cell, the method comprising:
programming a first two-terminal memory element to one or more states and a second two-terminal memory element to one or more states, wherein a state of the first two-terminal memory element and a state of the second two-terminal memory element are interdependent; and
measuring a difference signal between a first two-terminal memory element signal associated with the state of the first two-terminal memory element and a second two-terminal memory element signal associated with the state of the second two-terminal memory element.

* * * * *